(12) United States Patent
Martikkala et al.

(10) Patent No.: US 9,148,100 B2
(45) Date of Patent: Sep. 29, 2015

(54) PARALLEL AMPLIFIER ARCHITECTURE WITH FEEDBACK CONTROL BASED ON REFLECTED SIGNAL STRENGTH

(75) Inventors: Risto Tapani Martikkala, Oulu (FI); Kari Tapio Reponen, Kontio (FI); Tapio Mikael Vuopala, Haukipudas (FI)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 1648 days.

(21) Appl. No.: 12/463,191

(22) Filed: May 8, 2009

(65) Prior Publication Data

US 2009/0286495 A1 Nov. 19, 2009

(30) Foreign Application Priority Data

May 8, 2008 (EP) ..................................... 08103871

(51) Int. Cl.
*H04B 1/04* (2006.01)
*H03F 3/60* (2006.01)
(52) U.S. Cl.
CPC ...................................... *H03F 3/602* (2013.01)
(58) Field of Classification Search
USPC ...................................................... 455/127.3
See application file for complete search history.

(56) References Cited

U.S. PATENT DOCUMENTS

| 7,054,597 | B2 * | 5/2006 | Rosnell ......................... 455/110 |
| 8,005,445 | B2 * | 8/2011 | Kuriyama et al. ......... 455/127.3 |
| 2005/0270095 | A1 | 12/2005 | Burke et al. |
| 2007/0248185 | A1 | 10/2007 | Sorrells et al. |

* cited by examiner

*Primary Examiner* — John Poos
(74) *Attorney, Agent, or Firm* — Squire Patton Boggs (US) LLP

(57) ABSTRACT

Two input signals are amplified and combined into an output signal by first and second amplification stages and a combiner element. The first amplification stage includes a first signal modification unit and a first amplifier which receives a first input signal and provides a first intermediate signal. The second amplification stage includes at least a second amplifier which receives a second input signal and provides a second intermediate signal. The combiner element combines the first and the second intermediate signals and produces the output signal. In addition, a sensor senses a reflected signal on a signal line connecting the first amplifier and the combiner element and a feedback loop extends between the sensor and the signal modification unit. The signal modification unit is adapted to modify the first input signal depending on a measurement signal output by the first sensor.

17 Claims, 2 Drawing Sheets

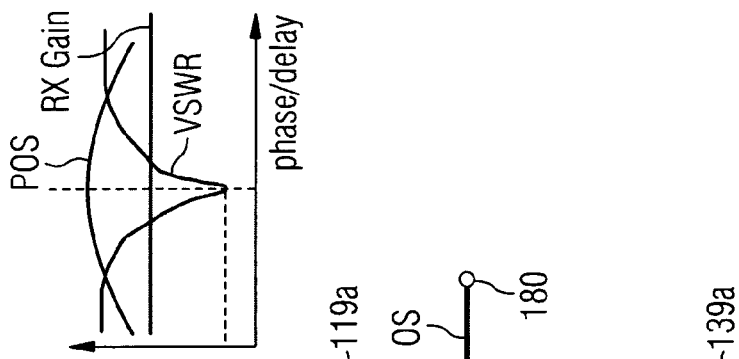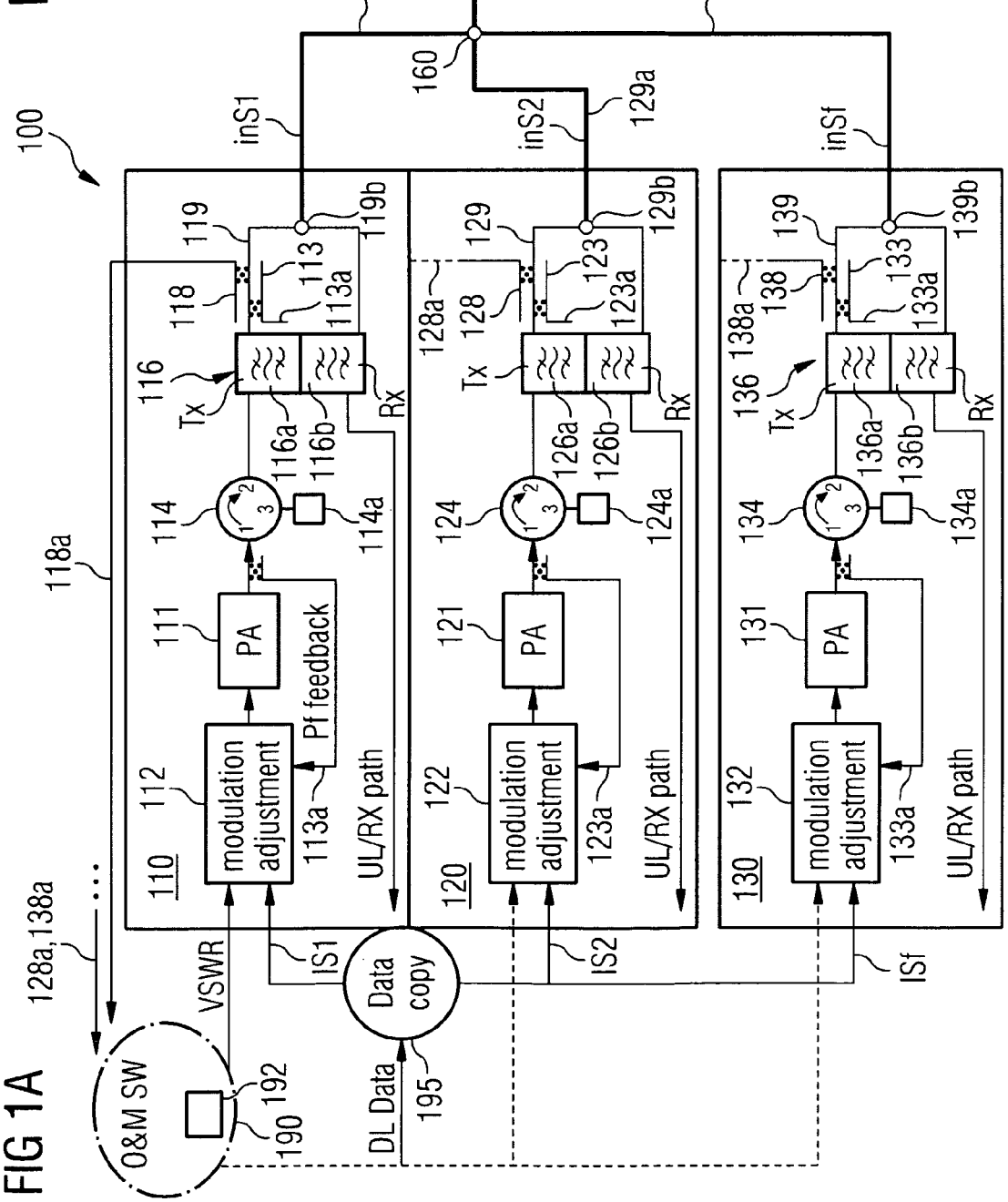

PARALLEL AMPLIFIER ARCHITECTURE WITH FEEDBACK CONTROL BASED ON REFLECTED SIGNAL STRENGTH

CROSS REFERENCE TO RELATED APPLICATIONS

This application is based on and hereby claims priority to European Application No. 08103871 filed on May 8, 2008, the contents of which are hereby incorporated by reference.

BACKGROUND

In the field of telecommunication networks, an apparatus, or circuit arrangement representing a parallel amplifier architecture, may be used for amplifying and combining at least two radio frequency input signals into a combined radio frequency output signal, where the combined output signal may have a high power. Described below is such an apparatus and a method for amplifying and combining at least two radio frequency input signals into a combined radio frequency output signal.

In the field of wireless transmitters, multiple amplifiers are often connected in parallel, and used to amplify a single signal. A transmitter, which uses multiple amplifiers stages connected in parallel is called a parallel amplifier transmitter. The outputs of the parallel amplifier stages in a transmitter are combined before transmission through one or more antennas.

The parallel amplifier architecture allows the use of smaller, less expensive amplifiers. Further, upon the failure of one of its multiple amplifiers, a parallel amplifier transmitter will not suffer a complete service outage, but will instead exhibit only a decrease in output power. By contrast thereto, in a single amplifier design, the failure of a single amplifier will cause a service outage for the entire transmitter.

Unfortunately, efficient combining of the output of several parallel amplifiers is not trivial. Amplifiers vary in amplitude and phase characteristics such that the same signal fed into several amplifiers will generally result in a slightly different output signal from each amplifier.

EP 1 201 027 B1 discloses a method and apparatus for using parallel amplifiers to efficiently amplify an information signal. The apparatus utilizes digital signal manipulation techniques in optimizing the modulation and timing of the input signals provided to each of the parallel amplifiers. The modulation and timing of the input signals are adjusted such that the power at the output of a combiner is maximized as compared to the sum of the power of combiner input signals.

However, a modulation and timing adjustment for a maximum output power is often not possible with existing parallel amplifier circuitries and additional functional blocks are required for the adjustment. Further, it is often very difficult to precisely determine the correct modulation and timing adjustment. However, not properly adjusted signals, which are supposed to be combined, may cause an inefficient signal combination respectively a reduced output power.

SUMMARY

There may be a need for providing a circuit arrangement and a method for amplifying and combining at least two radio frequency input signals into a combined radio frequency output signal in an efficient manner.

According to a first aspect, there is provided a circuit arrangement for amplifying and combining at least two radio frequency input signals into a combined radio frequency output signal. The described circuit arrangement includes (a) a first amplification stage, which is adapted to receive a first input signal and to provide a first intermediate signal in response to the first input signal, wherein the first amplification stage includes a first signal modification unit and a first amplifier, (b) a second amplification stage, which is adapted to receive a second input signal and to provide a second intermediate signal in response to the second input signal, wherein the second amplification stage includes at least a second amplifier, and (c) a combiner element, which is connected to both amplification stages and which is adapted to combine the first intermediate signal and the second intermediate signal in order to form the output signal. The provided circuit arrangement further includes (d) a first sensor, which is coupled to a first signal line connecting the first amplifier and the combiner element and which is adapted to sense a first reflected signal on the first signal line, and (e) a first feedback loop, which extends between the first sensor and the first signal modification unit, wherein the first signal modification unit is adapted to modify the first input signal depending on a first measurement signal of the first sensor.

The described circuit arrangement is based on the idea that by sensing the strength of a reflected signal the first signal modification unit can be controlled in a very sensitive way. This holds in particular when comparing the described circuit arrangement with known parallel amplifier architectures, which also include a feedback control, wherein however the feedback control relies only on the total output power.

The first signal modification unit may be adapted to process the feedback signal in an appropriate manner. In particular, the first signal modification may be a first signal modulation adjustment unit. Thereby, the first intermediate signal may be modified in such a manner, that the magnitude of the first reflected signal is minimized. In other words, the first reflected signal on the first signal line is used for appropriately adjusting the first input signal in order to achieve a highly efficient combination of the two intermediate signals.

The first reflected signal may originate from an at least partial reflection of the first intermediate signal for instance at the combiner element or at any other component located downstream with respect to the combiner element. However, the reflected signal may also be based on a portion of the second intermediate signal, which (a) is at least partially entering the first signal line via the combiner element and which (b) compared to the first intermediate signal is also propagating in the opposite direction towards the first amplifier.

The described circuit arrangement exhibiting a parallel amplifier architecture may be used in particular for transmitting stations for instance for mobile or cellular telecommunication networks. Therefore, the input signals may represent two data information input signals. Further, the two input signals may be derived originally from one and the same common input signal simply by splitting the common input signal. In particular, the described circuit arrangement may be used for transmitting radio frequency data signals downlink from a base station of a cellular telecommunication network towards User Equipments, which are coupled to the base station over the radio air interface.

By modifying the first input signal in an appropriate manner a maximum strength of the overall output signal can be achieved. Due to the usage of the strength of the first reflected signal as the feedback parameter, the first input signal can be modified in a very sensitive and in a very accurate manner. Thereby, a maximum power of the overall output signal can be achieved. In other words, the combination of the two intermediate signals can be achieved in a very efficient way, wherein the power losses are minimized.

According to an embodiment, the first sensor is adapted to measure the power of the first reflected signal and/or the Standing Wave Ratio and in particular the Voltage Standing Wave Ratio on the first signal line. The first sensor may be realized by a known reflected power coupler, which is coupled to the first signal line.

Using the power of the first reflected signal as the feedback parameter value for the signal modification unit may provide the advantage, that the corresponding sensor values can be picked up with sensor elements, which are widely used in the field of radio frequency (RF) technology and quite often used at each amplifier output for antenna monitoring purpose. Calculating the Standing Wave Ratio (SWR) for the first signal as the feedback parameter may provide further advantage that the first signal modification unit can be adjusted in an even more accurate manner.

According to a further embodiment, the circuit arrangement further includes a further first sensor for sensing the output behavior of the first amplifier. The output behavior may be for instance the signal strength and the modulation of the first amplifier. The further first sensor may be for instance a forward sensor, which is adapted to selective sense a signal traveling in a predetermined forward direction.

The further first sensor may be realized by a well known power coupler. The further first sensor may be coupled directly to an output of the first amplifier or indirectly to the first signal line. The further first sensor may be located downstream- or upstream of a filter element, but downstream with respect to the first amplifier.

In addition to the above described sensing of the strength of the first reflected signal also the strength of the amplifier output respectively the strength of the first intermediate signal can be used for adjusting the first signal modification unit. The strength may be for instance the voltage, the current and/or the power of the amplifier output respectively the first intermediate signal. By sensing the modulation, forward voltage, the forward current and/or the forward power of the first amplifier, the behavior of the first amplifier can be properly controlled before the signal is connected to the combining circuitry.

According to a further embodiment, the further first sensor is coupled to the first signal modification unit by a further first feedback loop. This may provide the advantage that the forward voltage, the forward current and/or the forward power of the first amplification stage can be used directly or indirectly as a further control parameter for adjusting the first modification unit in a proper way.

According to a further embodiment, the first signal modification unit is adapted to modify the modulation and/or the timing of the first input signal.

The modification unit may be for instance a I&Q modulation and up conversion part with a modulation and timing adjustment possibility by Software and/or Hardware. The modification unit may also introduce amplifier performance optimization based on feedback signals.

At this point it is mentioned that when first starting the described circuit arrangement a startup mode for determining the optimum adjustment for modulation and timing over the whole adjustment scale may be employed. After the startup mode the adjustment may be changed to a monitoring of the reflected signal (for instance VSWR and/or reflected power signal) and minor adjustment may be done if the reflected signal is getting worse. In case the described adjustment with respect to the reflected signal is not achieving the desired performance level or performance is degraded below the limit, the corresponding transmitter(s) respectively amplifier (s) may be deactivated. It has to be mentioned that shutting off may also be used for e.g. power saving purposes.

According to a further embodiment, the circuit arrangement further includes (a) a second signal modification unit, which is assigned to the second amplification stage, (b) a second sensor, which is coupled to a second signal line connecting the second amplifier and the combiner element and which is adapted to sense a second reflected signal on the second signal line, and (c) a second feedback loop, which extends between the second sensor and the second signal modification unit. Thereby, the second modification unit is adapted to modify the second input signal depending on a second measurement signal of the second sensor.

The usage of a second signal modification unit being coupled to a second sensor may provide the advantage that not only the first input signal but also the second input signal can be modified in an appropriate manner such that the efficiency of the intermediate signal combination is optimized. The second signal modification may be realized by a second signal modulation adjustment unit.

The second sensor may be coupled directly to the second modification unit via the second feedback loop. The same holds for the first sensor and the first modification unit. This means that the strength of the first and/or the second reflected signal can be used directly as an input parameter which is indicative for an appropriate modification, in particular for an appropriate modulation and/or timing modification of the first and/or the second input signal respectively.

According to a further embodiment, the first and the second signal modification unit are coupled to a central control unit.

The central control unit may be realized by so-called "operation and maintenance equipment," which is coupled to the first signal modification unit and to the second signal modification unit. The operation and maintenance equipment may be implemented either by hardware, software and/or a combination of hardware and software.

The central control unit may be adapted to calculate, based on the measurement values of the first and/or the second sensor, appropriate control signals for the first and/or the second signal modification unit. This means that any single or multiple reflected power signal may be used as an input parameter value for controlling the various signal modification units in an appropriate manner.

According to a further embodiment, the circuit arrangement further includes at least one filter element, which is located downstream with respect to the first and/or the second amplifier. This may provide the advantage that unwanted spectrum particles within the amplified RF signals, which may be caused by a certain non-linearity of the first and/or the second amplifier, can be removed before they are forwarded to an antenna element.

The filter element may be a part of a so called duplex filter, which provides filtering capability both for intermediate signals in the transmitting (TX) case and for a received signal in the receiving (RX) case. Thereby, the received signal may be provided by the same antenna element.

In this respect it has to be mentioned that the above given description of the parallel amplifier architecture only refers to a transmitting case. However, the usage of duplex filter may provide the advantage that a circuit arrangement, which may be used both for sending and receiving data signals, can be built up in a compact design with reasonable costs both for the electric components and for assembling the corresponding circuitry.

In this respect it is further mentioned that between the at least one filter element and the corresponding amplifier being located upstream there may be provided a protection device, which is capable of absorbing reflected signals, which have been rejected from the filter element. The protection device might be realized by a so-called circulator, which is a passive electronic component with three or more ports. The ports can be accessed in such a way that when a signal is fed into any port it is transferred to the next port only. One port of a three-port circulator may be terminated in a matched load for instance with a 50 Ohm Resistance. Thereby, the circulator represents an isolator, since a signal can travel in only one direction between the remaining ports. Hereby, the first port of the circulator is connected to the corresponding amplifier, the second port of the circulator is connected to the filter element and the third port of the circulator is occupied by the matched load.

According to a further embodiment, (a) the first sensor is integrated in a first filter element being assigned to the first amplification stage (110) or coupled to a port of a first circulator element (114) being assigned to the first amplification stage and/or (b) the second sensor is integrated in a second filter element being assigned to the second amplification stage (120) or coupled to a port of a second circulator element (124) being assigned to the second amplification stage. This may provide the advantage that the described usage of the strength of a reflected signal can be implemented in a very effective way in known parallel amplifier architectures. Thereby, the efficiency is mainly based on the fact that many filter elements used in the field of radio telecommunication are already equipped with sensor elements for measuring the VSWR. This also holds for circulator elements, which Loadport may be easily coupled for a sensor purpose. However, by contrast to the described circuit arrangement these sensor elements are currently only used for an antenna respectively a feeder fault detection by an alarm such that any problem in combining different amplified intermediate signals shall be detectable with a very short response time.

By contrast thereto, the described circuit arrangement uses the already existing VSWR information for optimum modulation and timing adjustment. Therefore, the input signal adjustments is clearly lower cost and simpler than other solutions, which would require more advanced combining parts with a modulation—or power detectors. This may mean that the described circuit arrangement can be built up with no extra expenditure for new hardware components. Further, the sensor elements may still be used for the VSWR alarm purposes.

In particular in most of the Base Transceiver Products manufactured and/or distributed by the applicant of this patent application, there is a build-in VSWR-sensor at each TX-antenna port for antenna alarm purposes. The same sensor could also be used for adjusting the signal modification units for instance by appropriate In-phase and Quadrature (I&Q) phase and/or timing adjustments.

According to a further embodiment, the filter element is located downstream with respect to the combiner element. This may provide the advantage that only one filter element can be used for all amplification stages. In other words, the number of filter elements being necessary for a clean output signal can be reduced and the described circuit arrangement can be built up in an effective manner.

It has to be mentioned, that a sensor, which may be integrated in the filter element, which according to the embodiment described here is a common filter element for all amplification stages, should not be used for providing a feedback signal to the first and/or the second signal modification unit. This holds also in the case if the sensor is capable of measuring the strength of a reflected signal and/or the VSWR on a central signal line connecting the combiner element and a downstream entity such as an antenna element. The feedback signals being used for controlling the first and/or the second signal modification unit may be picked up individually from the first signal line and/or the second signal line. Thereby, much more precise information regarding an optimal signal adjustment in the various signal modification units can be exploited in a beneficial manner.

It has to be further mentioned, that a protection device, which is capable of absorbing signals being reflected from the filter element, may be located between the combiner element and the filter element. This may provide the advantage that all amplifiers, which are assigned to different amplification stages, can be protected with a single protection device. Again, the protection device may be a well known circulator.

According to a further embodiment, the circuit arrangement further includes (a) at least one further amplification stage, which is adapted to receive a further input signal and to provide a further intermediate signal in response to the further input signal, wherein the further amplification stage includes at least a further signal modification unit and a further amplifier, (b) a further sensor, which is coupled to a further signal line connecting the further amplifier and the combiner element and which is adapted to sense a further reflected signal on the further signal line, and (c) a further feedback loop, which extends between the further sensor and the further signal modification unit, wherein the further modification unit is adapted to modify the further input signal depending on a further measurement signal of the further sensor.

By extending the described parallel amplifier architecture to three or even to more than three amplification stages the achievable amplification factor can be further increased. Thereby, at least all but one amplification stages are equipped with a feedback control, which operate with the strength of a reflected signal on the corresponding signal line.

It has to be mentioned that all technical aspects, which have been described above in connection with components or with the behavior of the first and/or the second amplification stage also apply to the corresponding components and the corresponding behavior of the further amplification stage(s).

According to a further embodiment, the length and in particular the electrical length of a first cable connecting a first output node of the first amplification stage with the combiner element, a second cable connecting a second output node of the second amplification stage with the combiner element, and/or a further cable connecting a further output node of the further amplification stage with the combiner element has a length, which corresponds to an integer multiple of half the wavelength of the radio frequency input signals. This may have the effect that a signal, which (a) originates from one of the amplification stages, which (b) enters another amplification stage from behind via the combiner element, and which (c) is at least partially reflected at a component of the other amplification stage exhibits a constructive interference or constructive superposition with the original signal at least at the combiner element. This means that the reflected signals are combined in the combiner element in phase such that the signal strength of the output signal at the combiner element and downstream of the combiner element is maximal.

It has to be mentioned that a constructive superposition respectively a constructive interference of the involved signals can be realized if (a) all input signal have the same carrier frequency and (b) all the cable lengths correspond to an integer of half the carrier wavelength. In particular for base transceiver stations the various input signals are created by splitting a common input signal. Therefore, the requirement (a) is automatically fulfilled. The requirement (b) can be easily fulfilled by choosing a design of the described parallel amplifier architecture, wherein the cable lengths are chosen appropriately.

In other words, by appropriately selecting the lengths of the cables connecting the combiner element with the various output nodes, which may act as a reflection point for signals accidentally entering the corresponding signal line, the efficiency of the signal combination can be increased by taking benefit of constructed interferences between the partially reflected intermediate signals and the corresponding intermediate signals.

For instance for a typical carrier wavelength of 2.1 GHz, the distance corresponding to a half of the wavelength is approximately 7 cm. Of course, when the described circuit arrangement is operating with a different frequency, the corresponding cable length have to be adopted according to the well known equation $\lambda \cdot f = c$. Thereby, c is the speed of light, f is the frequency of the carrier signal and $\lambda$ is the wavelength of the signal having the carrier frequency f.

According to a further embodiment, the circuit arrangement further includes a deactivation unit, which is connected to at least one of the amplification stages and which is adapted to selectively deactivate the at least one amplification stage.

This may provide the advantage that it is not necessary to always operate the described parallel amplifier architecture with all amplification stages. In a case wherein not the maximal output power is needed the parallel amplifier architecture may operate only with some of the amplification stages.

It has to be mentioned that the deactivation unit may be realized by a separate hardware entity. Alternatively, the deactivation unit may be a part of a circuit arrangement component, which also fulfils at least one another function. Apart from realizing the deactivation unit by hardware, the deactivation unit may also be realized by software and/or by a combination of Hardware and Software. Thereby, the deactivation unit may represent just a deactivation feature.

According to a further embodiment, the deactivation unit is further adapted to put at least one filter element of the at least one amplification stage out of tune with respect to the carrier to frequency of the input signals. In particular, the deactivation unit may be adapted to adjust the filter of the disabled amplifier out of tune. This may mean that the corresponding filter element is intentionally adjusted to a detuned frequency being significantly different from the frequency of the input signals. Of course, if a duplex filter is used, the detuning is carried out with the TX filter element.

In particular in the technical field of base transceiver stations most RF-module antenna filters are narrow band filters, which are tuned on the wanted channel respectively the wanted carrier frequency. Therefore, the power combination at the combiner element can be carried out with a minimal power loss when (a) the corresponding input coaxial cables have a length of half the wavelength of multiples of half the wavelength and (b) only some of the TX signals provided by a corresponding amplification stage are active. By adjusting the non used TX-signal antenna filter element(s) to a wrong channel, the remaining active transmitter signal going at least partly also towards the detuned filter element(s) is almost completely reflect back from them to the combiner element. However, since the reflected signal(s) is/are in the same phase than the corresponding forward signal from the active TX amplification stage(s), these signals will be combined in phase. In this respect it is utilized that a miss tuned filter output look's as an open port for the combiner with a poor matching such that the signal being reflected back to the combiner element is (a) comparatively strong and (b) in phase with the forward signals. This means that in the end the power of the output signal is almost equal to the summed signal of all active TX amplification stages. In a power balance only the attenuation within the involved cable is missing. Thereby, the attenuation corresponds to the double cable loss because the signal travels through the cable two times, one time before the reflection and one time after the reflection.

The provision of the deactivation unit respectively the deactivation feature and the described appropriate selection of the cable lengths allow for an effective power amplification respectively a minimum loss not only for the case when all combined signals are active and in phase. The deactivation unit and the described appropriate selection of the cable lengths allow also for an effective power amplification if one or several of the summed TX signals needs to shut off. Such a shut off may be for instance indicated if the total electrical power consumption of the described parallel amplification architecture has to be reduced and/or one or more transmitter parts exhibit a fault.

It has to be mentioned that in known parallel amplifier architectures, which also provide the possibility of selective switching off one or more amplification stages, external controlled RF-switches have to be used in order to disconnect the non used TX input signals for the combiner element. By contrast thereto, the described detuning of the filter elements in connection with the appropriate selection of the cable lengths provides for an effective deactivation respectively an effective decoupling without any additional parts for disconnecting the corresponding amplification stage.

According to a further aspect, there is provided a method for amplifying and combining at least two radio frequency input signals into a combined radio frequency output signal. The described method includes (a) receiving a first input signal and providing a first intermediate signal in response to the first input signal by a first amplification stage, wherein the first amplification stage includes a first signal modification unit and a first amplifier, (b) receiving a second input signal and providing a second intermediate signal in response to the second input signal by a second amplification stage, wherein the second amplification stage includes at least a second amplifier, (c) combining the first intermediate signal and the second intermediate signal in order to form the output signal by a combiner element, which is connected to both amplification stages, (d) sensing a first reflected signal on a first signal line connecting the first amplifier and the combiner element by a first sensor, (e) providing a first measurement signal being indicative for the first reflected signal to the first signal modification unit by a first feedback loop, which extends between the first sensor and the first signal modification unit, and (f) modifying the first input signal depending on the first measurement signal by the first modification unit.

The described method is based on the idea that by sensing the strength of a reflected signal the first signal modification unit can be controlled in a very sensitive way. Thereby, the first input signal can be modified in an appropriate manner such the signal combination within the combiner element will be very effective. This means that the power of the output signal can be maximized.

The first reflected signal may originate from an at least partial reflection of the first intermediate signal for instance at the combiner element or at any other component located downstream with respect to the combiner element. However, the reflected signal may also be based on a portion of the second intermediate signal, which (a) is at least partially entering the first signal line via the combiner element and which (b) compared to the first intermediate signal is also propagating in the opposite direction towards the first amplifier.

The described circuit arrangement exhibiting a parallel amplifier architecture may be used in particular for base transceiver stations for cellular mobile telecommunication networks. The two input signals may be derived originally from one and the same common input signal simply by splitting the common input signal by hardware or software.

It has to be noted that embodiments have been described with reference to different subject matters. In particular, some embodiments have been described with reference to an apparatus or circuit arrangement, whereas other embodiments have been described with reference to a method. However, a person skilled in the art will gather from the above and the following description that, unless other notified, in addition to any combination of features belonging to one type of subject matter also any combination between features relating to different subject matters, in particular between features of the apparatus and the method, is considered as to be disclosed herein.

The aspects defined above and further aspects are apparent from the examples of embodiment to be described hereinafter and are explained with reference to the examples of embodiment. The apparatus will be described in more detail hereinafter with reference to examples of embodiment to which the invention is not limited.

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 1A is a block diagram of a circuit arrangement representing a multi-stage parallel amplifier, wherein each amplifier stage is equipped with a TX filter element.

FIG. 1B is a graph on which there is plotted the measured VSWR and the Power of the output signal of the circuit arrangement shown in FIG. 1A as a function of a phase respectively a timing adjustment.

DETAILED DESCRIPTION OF THE PREFERRED EMBODIMENT

Figure 2B:
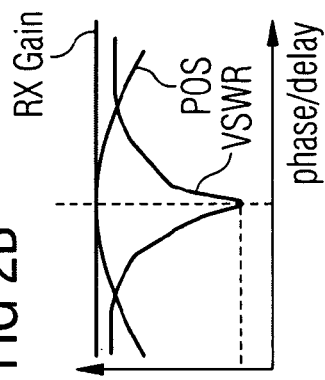
FIG. 2B is a graph on which there is plotted the measured VSWR and the Power of the output signal of the circuit arrangement shown in FIG. 2A as a function of a modulation respectively a timing adjustment.

Reference will now be made in detail to exemplary embodiments which are illustrated in the accompanying drawings, wherein like reference numerals refer to like elements throughout.

The illustration in the drawing is schematically. It is noted that in different figures, similar or identical elements are provided with reference signs, which are different from the corresponding reference signs only within the first digit.

FIG. 1A shows a block diagram of a circuit arrangement 100 representing a multi-stage parallel amplifier architecture. The circuit arrangement 100 includes a first amplification stage 110, a second amplification stage 120 and a further amplification stage 130. It has to be mentioned that the circuit arrangement 100 can also include more than three amplification stages, which are all connected in parallel in order to provide for a significant output power enhancement.

According to the embodiment described here the circuit arrangement 100 is a part of a base station transceiver of a mobile telecommunication network. A downlink (DL) data signal, which is provided to the circuit arrangement 100 and which is supposed to be transmitted over the air interface to User Equipments such as for instance mobile phones, is provided to a splitting unit 105. The splitting unit 105, which is realized by Hardware and/or by Software, provides three identical data input signals IS1, IS2 and ISf. Of course, if more than three amplification stages are used the DL data signal will have to be split in a higher number of data input signals, wherein the number equals to the number f amplification stages.

As can be seen from FIG. 1A, the first input signal IS1 is fed into a first signal modification unit 112 of the first amplification stage 110. According to the embodiment described here the first signal modification unit is a first modulation pre-adjustment block 112. Accordingly, the second input signal IS2 is fed into a second signal modification unit respectively a second modulation pre-adjustment block 122 of the second amplification stage 120 and the further input signal ISf is fed into a further signal modification unit respectively a further modulation pre-adjustment block 132 of the further amplification stage 130. Downstream of the modification units 112, 122 and 132 is connected a first amplifier 111, a second amplifier 121 and a further 131 amplifier, respectively. According to the embodiment described here the amplifiers 111, 121 and 131 are power amplifiers. This is indicated in FIG. 1A by the abbreviation "PA".

In the following the construction or the design of the amplification stages 110, 120, 130 will be described by way of example with reference to the first amplification stage 110. However, the other amplification stages 120 and 130 are built up in the same way.

Downstream with respect to the amplifier 111 there is located a protection device 114, which is used for protecting the output of the amplifier against reflected signals entering back to the amplifier 111 from the antenna line side. According to the embodiment described here the protection device is a so called circulator 114, which has at least three ports.

The ports can be accessed in such a way that when a signal is fed into a first port No. 1 being connected with the amplifier 111, the signal is transferred via a second port No. 2 to a first filter element 116a. If there is for any reason a reflected signal propagating in the opposite direction towards the amplifier 111 and entering the circulator on port No. 2 this signal will be directed to the third port No. 3, where it will be absorbed by a load 114a, which represents a matched load having for instance a terminating impedance of 50 Ohm.

At this point it is mentioned that the load can also be coupled with a sensor 114a feedback. The sensor might carry over the measurement functions of the first sensor 118. This means that the sensor 114a may be used for sensing the first reflected signal on the first signal line 119. In this case the feedback line 118a would originate at the sensor 114a. This modification can of course also be applied to the other amplification stages 120 and 130.

The amplified RF signals provided by the amplifier 111 are fed into the above mentioned first filter element 116a, which is located downstream with respect to the protection device 114. As can be seen from FIG. 1A, the first filter element 116a is a part of a duplex filter 116, which also includes a RX filter 116b. The RX filter 116b is used for signals which have been picked up by a not depicted antenna element and which are forwarded to an also not depicted detection circuit via a signal line being indicated in FIG. 1A with the label "UL/RX path". Since the embodiments described within this application focus on the transmitting case (TX), no further details are given with respect to the processing of received signals.

Downstream of the TX filter 116a there are located two sensors, a first sensor 118 and a further first sensor 113. According to the embodiment described here the further first sensor is a first forward sensor 113. Both the first sensor 118 and the first forward sensor 113 are coupled to a first signal line 119 of the first amplification stage 110.

According to the embodiment described here the first forward sensor 113 is a so called power coupler 113, which is adapted to sense the power of signals traveling downstream from the amplifier 111 respectively the TX filter 116a. The power coupler 113 may be used for power monitoring purpose and for calculating VSWR. The first forward feedback loop 113a may be used for optimizing the behavior of the amplifier 111 for optimum modulation result. For the sake of clarity of FIG. 1A the first forward feedback loop 113a is indicated in an interrupted manner because in some other type amplifier solution Pf feedback is not necessary.

According to the embodiment described here the first signal modification unit 112 is adapted to adjust the modulation and/or the timing of the first input signal IS1 in an appropriate way. Further details regarding this modulation and/or timing adjustment are given below in this application.

Opposite of the first forward power coupler 113 there is located the first sensor 118. According to the embodiment described here the first sensor is a reflected power coupler 118, which is also coupled to the first signal line 119. The reflected power coupler 118 is adapted to sense a first reflected signal on the first signal line 119, which is propagating towards the TX filter 116a. The reflected power coupler 118 is adapted to sense the reflected power and to be able to calculate the VSWR on the first signal line 119, which is indicative for the power of the reflected signals on the first signal line 119.

In this respect it is mentioned that the VSWR can be calculated simply from the measured reflected power Pr and the measured forward power Pf by using the following well known equation:

$$VSWR=[1+(Pr/Pf)]/[1-(Pr/Pf)]$$

Either the Pr and/or the VSWR can be used for the adjustment of the signal modification units 112, 122 and/or 132.

As can be seen from FIG. 1A, the circuit arrangement 100 further includes a first feedback loop 118a, which is connecting the reflected power coupler 118 to a central control unit 190. According to the embodiment described here the central control unit is an Operation and Maintenance equipment 190.

At a first output node 119b there is provided a first intermediate Signal inS1. The first intermediate Signal inS1 is based on or at least influenced by (a) the modulation and/or timing adjustments carried out by the first signal modification unit 112, by (b) the amplification factor and potential distortions of the amplifier 111 and/or by (c) the frequency response of the TX filter 116a.

As has already been mentioned above, the second amplification stage 120 and the further amplification stage 130 are built up in the same way as the first amplification stage 110. Accordingly, these amplification stages 120 and 130 provide a second intermediate Signal inS2 at a second output node 129b and a further intermediate Signal inSf at a further output node 139b.

As can be seen from FIG. 1A, these intermediate signals inS1, inS2 and inSf are combined within a combiner element 160. The combined signal is outputted at an output node 180. The combined signal represents the output signal OS of the described circuit arrangement 100. The output signal OS may be fed in a known manner to a not depicted antenna element.

The combiner element 160 may be any node which typically includes a good matching between the characteristic wave impedances of the cables 119a, 129a, 139a being connected to the node. The combiner element 160 may be realized just by soldering suitable type RF cables together. Thereby, the middle pins of the RF cables are connected together and the ground shielding of the RF cables are connected together.

According to the embodiment described here the Operation and Maintenance equipment 190 receives feedback signals from the first reflected power coupler 118, from the second reflected power coupler 128 and from the further reflected power coupler 138. The feedback signals are indicative for the respectively measured VSWR on the signal lines 119, 129 and 139. The VSWR signals are forwarded to the corresponding signal modification units 112, 122, 132.

The signal modification units 112, 122 and 132 are controlled by the respective reflected power—or VSWR feedback signals. Thereby, the modulations and/or the timings of the input signals IS1, IS2 and ISf are adjusted in such a manner that the corresponding reflected signals on the signal lines 119, 129 and 139, respectively, are minimized. The minimization of the various reflected signals has the effect that in the combiner element 160 the intermediate signals inS1, inS2 and inSf are automatically combined in an efficient manner with respect to the power of the output signal OS.

According to the embodiment described here a first cable 119a connecting the first output node 119b with the combiner element 160 has a length, which corresponds to an integer multiple of half the wavelength of the radio frequency input signal IS1. The same holds for the lengths of the second cable 129a and of the further cable 139a.

The described choices of the cable lengths has the effect, that at the combiner element a signal, which (a) originates from one of the amplification stages, which (b) enters another amplification stage from behind via the combiner element, and which (c) is at least partially reflected at the TX filter of the other amplification stage exhibits a constructive interference or a constructive superposition with the original signal. This means that also such reflected signals are combined in the combiner element 160 at full 360 degrees phase shift thus being in phase. Therefore, the signal strength of the output signal OS is maximal.

It has to be mentioned that of course a constructive superposition respectively a constructive interference relies on the fact that all input signals IS1, IS2 and ISf have the same carrier frequency. However, since the input signals IS1, IS2 and ISf are branched off the same common input DL data signal this requirement is automatically fulfilled.

By appropriately selecting the lengths of the cables 119a, 129a and 139a connecting the combiner element with the various output nodes, which may act as reflection points for signals accidentally entering the corresponding signal line, the efficiency of the signal combination can be increased by taking benefit of constructed interferences between the partially reflected intermediate signals and the corresponding intermediate signals.

The circuit arrangement 100 further includes a deactivation unit 192. According to the embodiment described here the unit 192 is integrated in the control unit 190. This integration can be realized by hardware, software, or a combination between hardware components and software components. However, it has to be mentioned that the deactivation unit 192 could also be arranged separately from the control unit 190.

The deactivation unit 192 is connected in a non depicted manner with at least one of the amplification stages 110, 120, 130. Further, the deactivation unit 192 is adapted to selectively deactivate the at least one of the amplifiers 111, 121 and/or 131. By deactivation at least one of the amplification stages 110, 120, 130 the electrical power consumption of the circuit arrangement 100 can be reduced significantly if not the maximal output power is needed. Specifically, if the required output power of the output signal OS can be provided with a reduced number of amplification stages, the dispensable amplification stages can be switched off.

According to the embodiment described here the deactivation unit 192 is further adapted to put at least one TX filter element 116a, 126a, 136a out of tune with respect to the carrier frequency of the input signals IS1, IS2, ISf. Thereby, the TX filter elements of deactivated amplification stages are detuned. By adjusting the non used TX-signal antenna filter element(s) to a significantly detuned frequency an active transmitter signal of a non deactivated amplification stage being directed towards the detuned filter element(s) is almost completely reflect back from them to the combiner element 160. However, since the reflected signal(s) is/are in the same phase than the corresponding forward signal from the active TX amplification stage(s), these signals will be combined in phase. In this respect benefit is taken from the fact that a miss tuned filter output look's as an open port for the combiner with a poor matching such that the signal is reflected back almost completely to the combiner element.

In the circuit arrangement 100 adjustments of In-phase and quadrature (I&Q) components of the respective input signals IS1, IS2, ISf are based on VSWR and/or reflected power information read at least from one of the VSWR/Reflected Power sensors. The corresponding measurement signals are provided from the sensors directly to the Operation and Maintenance equipment 190, which controls the signal modification units 112, 122 and/or 132. Thereby, measurement values representing the reflected power or the VSWR can be used directly for optimizing the modulation and timing for a maximum output power. Also adjustment information from measuring the reflected power or the VSWR within one amplification stage can be distributed to other amplification stages when combining e.g. more than two amplification stages respectively amplification modules. In case of combining only two amplification modules it is not necessary to adjust the second amplification module because the input data are the same for both amplification modules.

It has to be mentioned that if existing amplification modules for main antennas are combined after a TX/RX duplex filter a Masthead amplifier—or RX Diversity antenna should be employed in order to avoid a problem with a dividing loss of the RX main signal dropping RX Gain by approximately 3 dB.

It has to be further mentioned that in the circuit arrangement 100 instead of employing the reflected power couplers 118, 128 and 138 it would be also possible to take the reflected power information from the respective $3^{rd}$ port 114a, 124a and 134a of the circulators 114, 124 and 134.

FIG. 1B is a graph in which there is plotted the measured Voltage Standing Wave Ratio VSWR in one of the signal lines 119, 129 or 139 and the Power of the output signal POS at the output node 180 of the circuit arrangement 100 as a function of a phase respectively a timing adjustment. Thereby, the phase respectively the timing adjustment is carried out by the corresponding signal modification unit 112, 122 or 132.

As can be seen from the comparatively sharp minimum of the VSWR, a measurement value being indicative for the VSWR and/or the reflected power allows for a much more precise phase and/or timing adjustment than the comparatively flat curve depicting the output power POS.

FIG. 1B further shows the Gain RXGain of the uplink input signal as a function of the phase respectively the timing adjustment. This Gain exhibits an almost completely flat behavior but is approximately e.g. 3 dB lower than without combining circuitry as RX/UL signal is naturally split in the combining circuit as many RX/UL outputs as there are TX/DL inputs combined.

Figure 2A:
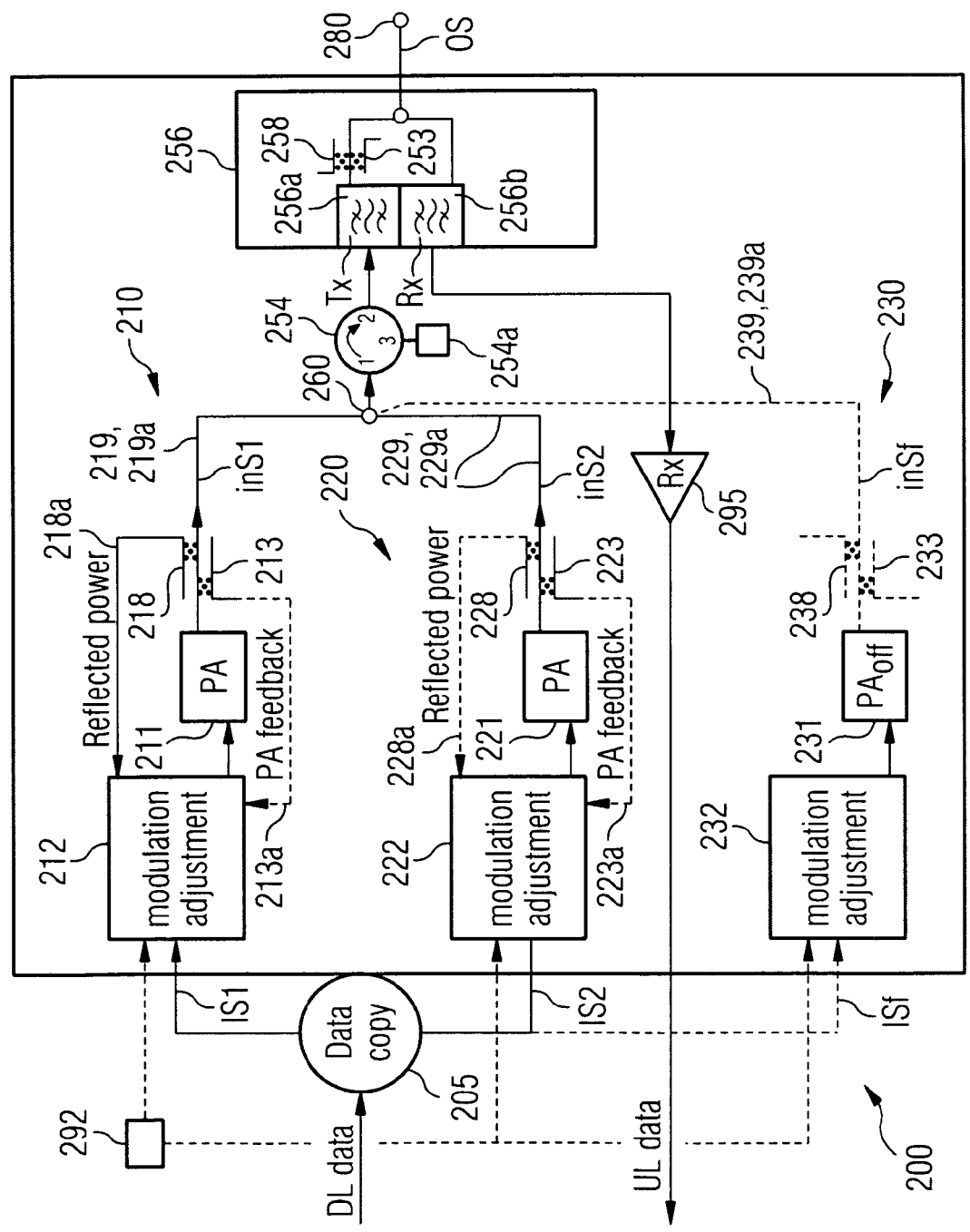
FIG. 2A is a block diagram of a circuit arrangement representing a multi-stage parallel amplifier, wherein a common TX filter element is used for the output signals of all amplifier stages.

FIG. 2A shows a block diagram of a circuit arrangement 200 representing a multi-stage parallel amplifier architecture. The circuit arrangement 200 includes a first amplification stage 210, a second amplification stage 220 and a further amplification stage 230. It has to be mentioned that also the circuit arrangement 200 can also have more than three amplification stages, which are all connected in parallel in order to provide for a significant output power enhancement.

The circuit arrangement 200 includes a splitting unit 205 for providing three identical data input signals IS1, IS2 and ISf. Of course, if more than three amplification stages are used the DL data signal can be split in a higher number of data input signals, wherein the number equals to the number of amplification stages.

The first input signal IS1 for the first amplification stage is fed into a first signal modification unit 212, which is a first modulation pre-adjustment block 212. Accordingly, the second input signal IS2 is fed into a second signal modification unit respectively a second modulation pre-adjustment block 222 of the second amplification stage 220 and the further input signal ISf is fed into a further signal modification unit respectively a further modulation adjustment block 232 of the further amplification stage 230. Downstream of the modification units 212, 222 and 232 there is located a first amplifier 211, a second amplifier 221 and a further 231 amplifier, respectively.

The first amplifier 211 is connected to a combiner element 260 via a first signal line 219. The second amplifier 221 is connected to the combiner element 260 via a second signal line 229 and the further amplifier 231 is connected to the combiner element 260 via a further signal line 239. In the combiner element 260 a first intermediate signal inS1, a second intermediate signal inS2 and a further intermediate signal inSf are combined.

Downstream of the amplifier 211 there are located two sensors, a first sensor 218 and a further first sensor 213. Specifically, the further first sensor may be a forward sensor 213. Both the first sensor 218 and the first forward sensor 213 are coupled to the first signal line 219.

According to the embodiment described here the first forward sensor 213 is a so called forward power coupler 213, which is adapted to sense the power of signals traveling from the amplifier 211 to the combiner element 260. The forward power coupler 213 is coupled to the first signal modification unit 212 via a first forward feedback loop 213a for optimizing the amplifier 211 input for an optimum amplifier output performance.

Opposite of the forward power coupler 213 there is located the first sensor 218. According to the embodiment described here the first sensor is a reflected power coupler 218, which is also coupled to the first signal line 219. The reflected power coupler 218 is adapted to sense a first reflected signal on the first signal line 219, which is propagating towards the amplifier 211. According to the embodiment described here the reflected power coupler 218 is adapted to sense the reflected power and may also be used for calculating the VSWR on the first signal line 219.

Via a first feedback loop 218a, which is connecting the reflected power coupler 218 to the first signal modification unit 212, a measurement value of the reflected power coupler 218 is forwarded to the first signal modification unit 212. This measurement value is taken into account by the first signal modification unit 212 when adjusting the modulation and/or the timing of the first input signal IS1 in an appropriate way in order to achieve a maximum power output signal OS.

The second amplification stage 220 and the further amplification stage 230 are built up in the same way as the first amplification stage 210. For the sake of compactness of this application the components of the second amplification stage 220 and the further amplification stage 230 are not described in detail. Reference can be made to the description of the components and the mode of operation of the first amplification stage described above.

According to the embodiment described here a first cable 219a connecting the first amplifier 211 with the combiner element 260 has a length, which corresponds to an integer multiple of half the wavelength of the radio frequency input signal IS1. The same holds for the lengths of the second cable 229a and of the further cable 239a.

As has already been above with reference to FIG. 1A, the described choices of the cable lengths has the effect, that at the combiner element 260 a signal, which (a) originates from one of the amplification stages, which (b) enters into the cable 219a, 229a or 239a of another amplification stage and which (c) is at least partially reflected at the output port of the corresponding amplifier 211, 221 or 231, respectively, exhibits a constructive interference or constructive superposition with the original signal. This means that also such reflected signals are combined in the combiner element 260 at a full 360 degree phase shift, thus being in phase with the forward signal at the combining point.

As can be seen from FIG. 2A, downstream of the combiner element 260 there is provided a protection device 254. According to the embodiment described here the protection device is a circulator 254 having three ports. At the third port there is connected a load 254a, which represents a matched load having for instance a terminating impedance of 50 Ohm.

The mode of operation of the circulator 254 is the same as the mode of operation of the circulators 114, 124 and 134 shown in FIG. 1A. Therefore, at this point reference is made to the above given detailed description of the circulator 114.

Following the circulator 254 there is provided a duplex filter 256, which includes a TX filter 256a and a RX filter 256b. The output port of the TX filter 256a and the input port of the RX filter 256b are both connected to an output node 280 of the circuit arrangement 200. The output of the RX filter 256b is fed to a RX amplifier 295, which itself provides an output signal which can be processed in a known manner in order to extract uplink data (UL data) originating for instance from a User Equipment such as a mobile phone.

It has to be mentioned that the TX filter 256a may also be provided with a forward power coupler 253 and a reflected power coupler 258. However, since the TX filter 256a is not used for an individual amplification stages output but for the combined output signal these sensors 253 and 258 should not be used for controlling the adjustment procedure of any one of the signal modification units 212, 222 and/or 232.

The circuit arrangement 200 is adapted to selectively deactivate the at least one of the amplifiers 211, 221 and/or 231. According to the embodiment described here this is done by a deactivation unit 292. The deactivation unit 292 is connected with at least one of the amplification stages 210, 220, 230. Further, the deactivation unit 292 is adapted to selectively deactivate the at least one of the amplifiers 211, 221 and/or 231. By deactivation at least one of the amplification stages 210, 220, 230 the electrical power consumption of the circuit arrangement 200 can be reduced significantly if not the maximal output power is needed. Specifically, if the required output power of the output signal OS can be provided with a reduced number of amplification stages, the dispensable amplification stages can be switched off.

According to the operational state of the circuit arrangement 200 depicted in FIG. 2A the further amplifier 231 is switched off. This deactivation of the further amplification stage 230 may be carried out for instance because a reduction of the overall electrical power consumption of the circuit arrangement 200 is required in a situation, where the maximal output power is not needed.

When the amplifier 231 is switched off, the output port of the amplifier 231 may be designed not to represent a good matched load in the off state for a signal entering the further cable 239a. Due to a poor matching a signal entering the cable 239a from the combiner element 260 will be reflected back from the output port of the amplifier 231 towards the combiner element 260. Due to the above described appropriate selection of the length of the cable 239a at the combiner element the at least partial reflected signal and the original signal originating from at least one of the activated amplification stages 210, 220 will be superimposed in a constructive manner (the superimposed signals have a phase shift of 360 degrees). Therefore, the power of the signal being present at the combiner element 260 and also at the output node 280 will be maximized.

When comparing the designs of the circuit arrangement 200 and the circuit arrangement 100 the following differences are given:

A) The circuit arrangement 200 uses only one circulator and only one duplex filter 256. Thereby, the circulator 254 protects all amplifiers 211, 221 and 231 against unwanted power reflection signals originating for instance from the downstream TX filter 256a or the antenna line downstream from OS 280. A single duplex filter is also better solution for size and cost.

B) For realizing both a control of the signal modification units depending on the reflected power on the power sensors 213, 218, 223, 228, 233 and 238 have to be employed. With the sensors 218, 228 and 238 the reflected power can be used directly inside each amplification module 210, 220, 230 for optimizing the modulation & timing in order to achieve a maximum output signal OS without using a central control unit respectively an Operation and Maintenance equipment.

C) If there are sensors integrated within the common duplex filter 256 these sensors may not be used for providing feedback signals for the signal modification units 212, 222, 232, because in the circuit arrangement 200 the signal combining is done before the common TX filter 256a.

D) With the circuit arrangement 200 an in-phase power combination within the combiner element 260 being located upstream with respect to the TX filter 256a will not cause an extra loss for the RX Uplink signals. This is in particular advantageous if a corresponding base transceiver station does not employ RX masthead amplifiers or separated Uplink Diversity antennas and receivers.

E) As a conclusion the arrangement 100 is better when combining power of physically separate units/modules with a need for a central controlling of O&M SW. Arrangement 200 is naturally better in size—, cost—and RX Gain for a single physical module/unit.

FIG. 2B is a graph in which there is plotted the measured Voltage Standing Wave Ratio VSWR in one of the signal lines 219, 229 or 239 and the Power of the output signal POS at the output node 280 of the circuit arrangement 200 as a function of a modulation respectively a timing adjustment within at least one of the signal modification units 212, 222 and 232.

As can be seen from the comparatively sharp minimum of the VSWR curve a measurement value being indicative for the VSWR allows for a much more precise modulation and/or timing adjustment than the comparatively flat curve depicting the output power POS.

FIG. 2B further shows the Gain RXGain of the uplink input signal as a function of the modulation respectively the timing adjustment. This Gain exhibits an almost completely flat behavior. However, compared to the corresponding Gain of the circuit arrangement 100 shown in FIG. 1B, the RXGain of the circuit arrangement 200 is approximately e.g. 3 dB higher as RX/UL signal is not going to combining circuitry, thus not split for different RX/UL outputs.

It should be noted that the term "include(s)" does not exclude other elements or operations and "a" or "an" does not exclude a plurality. Also elements described in association with different embodiments may be combined.

To recapitulate the above described embodiments, one can state: It is described a circuit arrangement and a method for amplifying and combining two input signals into an output signal. The circuit arrangement 100 includes a first amplification stage 110 including a first signal modification unit 112 and a first amplifier 111, which receives a first input signal IS1 and provides a first intermediate signal inS1, a second amplification stage 120 including at least a second amplifier 121, which receives a second input signal IS2 and provides a second intermediate signal inS2, a combiner element 160 for combining the first and the second intermediate signal, a first sensor 118 for sensing a first reflected signal on a first signal line 119 connecting the first amplifier 111 and the combiner element 160, and a first feedback loop 119a extending between the first sensor 118, 114a and the first signal modification unit 112. The first signal modification unit 112 is adapted to modify the first input signal IS1 depending on a first signal of the first sensor 118.

The system also includes permanent or removable storage, such as magnetic and optical discs, RAM, ROM, etc. on which the process and data structures can be stored and distributed. The processes can also be distributed via, for example, downloading over a network such as the Internet. The system can output the results to a display device, printer, readily accessible memory or another computer on a network.

A description has been provided with particular reference to exemplary embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

What is claimed is:

1. An apparatus for amplifying and combining at least two radio frequency input signals into a combined radio frequency output signal, comprising
    a first amplification stage adapted to receive a first input signal and to provide a first intermediate signal in response to the first input signal, the first amplification stage including a first signal modification unit and a first amplifier;
    a second amplification stage adapted to receive a second input signal and to provide a second intermediate signal in response to the second input signal, the second amplification stage including at least a second amplifier;
    a combiner element, connected to both said first and second amplification stages, adapted to combine the first intermediate signal and the second intermediate signal to form the combined radio frequency output signal;
    a first signal line connecting the first amplifier and said combiner element;
    a first sensor, coupled to said first signal line, adapted to sense a first reflected signal on said first signal line and produce a first measurement signal; and
    a first feedback loop extending between said first sensor and said first signal modification unit which is adapted to modify the first input signal depending on the first measurement signal output by said first sensor.

2. The apparatus according to claim 1, wherein said first sensor measures at least one of a power of the first reflected signal and a Voltage Standing Wave Ratio on said first signal line.

3. The apparatus according to claim 2, further comprising a second sensor sensing output behavior of the first amplifier.

4. The apparatus according to claim 3, wherein further comprising a second feedback loop connecting said second sensor to said first signal modification unit.

5. The apparatus according to claim 4, wherein said first signal modification unit is adapted to modify at least one of modulation and timing of the first input signal.

6. The apparatus according to claim 2, further comprising:
    a second signal line connecting the second amplifier and said combiner element;
    a second sensor, coupled to said second signal line, adapted to sense a second reflected signal on said second signal line and produce a second measurement signal;
    a second signal modification unit, assigned to said second amplification stage, adapted to modify the second input signal depending on the second measurement signal output by said second sensor; and
    a second feedback loop, extending between said second sensor and said second signal modification unit.

7. The apparatus according to claim 6, further comprising a central control unit coupled to said first and second signal modification units.

8. The apparatus according to claim 7, further comprising at least one filter element, located downstream with respect to at least one of the first and second amplifiers.

9. The apparatus according to claim 8, further comprising one of a first filter element and a first circulator element assigned to said first amplification stage and/or one of a second filter element and a second circulator element assigned to said second amplification stage, where said first sensor is either integrated in said first filter element or coupled to a port of said first circulator element, and/or said second sensor is integrated in said second filter element or coupled to a port of said second circulator element.

10. The apparatus according to claim 8, wherein said at least one filter element is located downstream with respect to said combiner element.

11. The apparatus according to claim 10, further comprising
    at least one third amplification stage, adapted to receive a third input signal and to provide a third intermediate signal in response to the third input signal, including at least a third signal modification unit and a third amplifier;
    a third signal line connecting the third amplifier and said combiner element;
    a third sensor, coupled to said third signal line, adapted to sense a third reflected signal on said third signal line and produce a third measurement signal, said third modification unit adapted to modify the third input signal depending on the third measurement signal output by said third sensor; and a third feedback loop, extending between the third sensor and said third signal modification unit.

12. The apparatus according to claim 11, wherein the radio frequency input signals have a wavelength, said apparatus further comprising at least one of a first cable, having a first length, connecting a first output node of the first amplification stage to said combiner element;

a second cable, having a second length, connecting a second output node of the second amplification stage to said combiner element; and at least one third cable, each having a third length and each connecting a third output node of a corresponding third amplification stage to said combiner element, and wherein each of the first, second and third lengths corresponds to an integer multiple of half the wavelength of the radio frequency input signals.

13. The apparatus according to claim 12, further comprising a deactivation unit connected to at least one of the first, second and third amplification stages which said deactivation unit is adapted to selectively deactivate.

14. The apparatus according to claim 13, wherein each of the first, second and third input signals have a carrier frequency, and wherein said deactivation unit is further adapted to put at least one of the first, second and third filter elements of the at least one of the first, second and third amplification stages out of tune with respect to the carrier frequency of at least one of the first, second and third input signals.

15. A method for amplifying and combining at least two radio frequency input signals into a combined radio frequency output signal, comprising:

receiving a first input signal;

providing a first intermediate signal in response to the first input signal by a first amplification stage, the first amplification stage including a first signal modification unit and a first amplifier;

receiving a second input signal;

providing a second intermediate signal in response to the second input signal by a second amplification stage, the second amplification stage including at least a second amplifier;

combining the first and second intermediate signals to form the output signal by a combiner element connected to the first and second amplification stages;

sensing, by a first sensor, a first reflected signal on a first signal line connecting the first amplifier and the combiner element;

providing a first measurement signal, from the first sensor, indicative of the first reflected signal to the first signal modification unit via a first feedback loop extending between the first sensor and the first signal modification unit; and modifying the first input signal by the first modification unit based on the first measurement signal.

16. The apparatus according to claim 1, wherein the first signal modification unit performs modulation adjustment.

17. The apparatus according to claim 1, wherein at the first amplification stage a signal, picked up to calculate a Voltage Standing Wave Ratio, is fed via a loop outside.

* * * * *